United States Patent [19]

Mollier

[11] 4,344,155
[45] Aug. 10, 1982

[54] METHOD OF AND APPARATUS FOR INSCRIBING A CONTROL CHARACTER IN A MEMORY

[75] Inventor: Jean H. Mollier, Bougival, France

[73] Assignee: Compagnie Internationale pour l'Informatique CII-Honeywell Bull (Societe Anonyme), Paris, France

[21] Appl. No.: 108,337

[22] Filed: Dec. 31, 1979

[51] Int. Cl.³ .............................................. G11C 11/40
[52] U.S. Cl. .................................... 365/200; 365/201; 371/24
[58] Field of Search .................... 365/200, 201; 371/4, 371/21, 24, 23, 18, 71

[56] References Cited

U.S. PATENT DOCUMENTS

| 3,518,413 | 6/1970 | Holtey | 371/17 |
| 3,940,601 | 2/1976 | Henry et al. | 371/24 |
| 4,034,194 | 7/1977 | Thomas et al. | 371/17 |
| 4,047,163 | 9/1977 | Choate et al. | 365/200 |

*Primary Examiner*—Terrell W. Fears
*Attorney, Agent, or Firm*—Lowe, King, Price & Becker

[57] ABSTRACT

A memory matrix is divided into a plurality of zones, one of which has a predetermined address and is set aside for a control character having multiple bits, stored in plural cells of the one zone. Each cell stores electric charge, with the cells in the control zone storing a charge no greater than that in the remaining zones. After the cells of the control zone have been initially supplied with the predetermined control character, the cells of the control zone are isolated from write command signals during normal operation. The cells of the control zone can be read out during normal operation.

10 Claims, 7 Drawing Figures

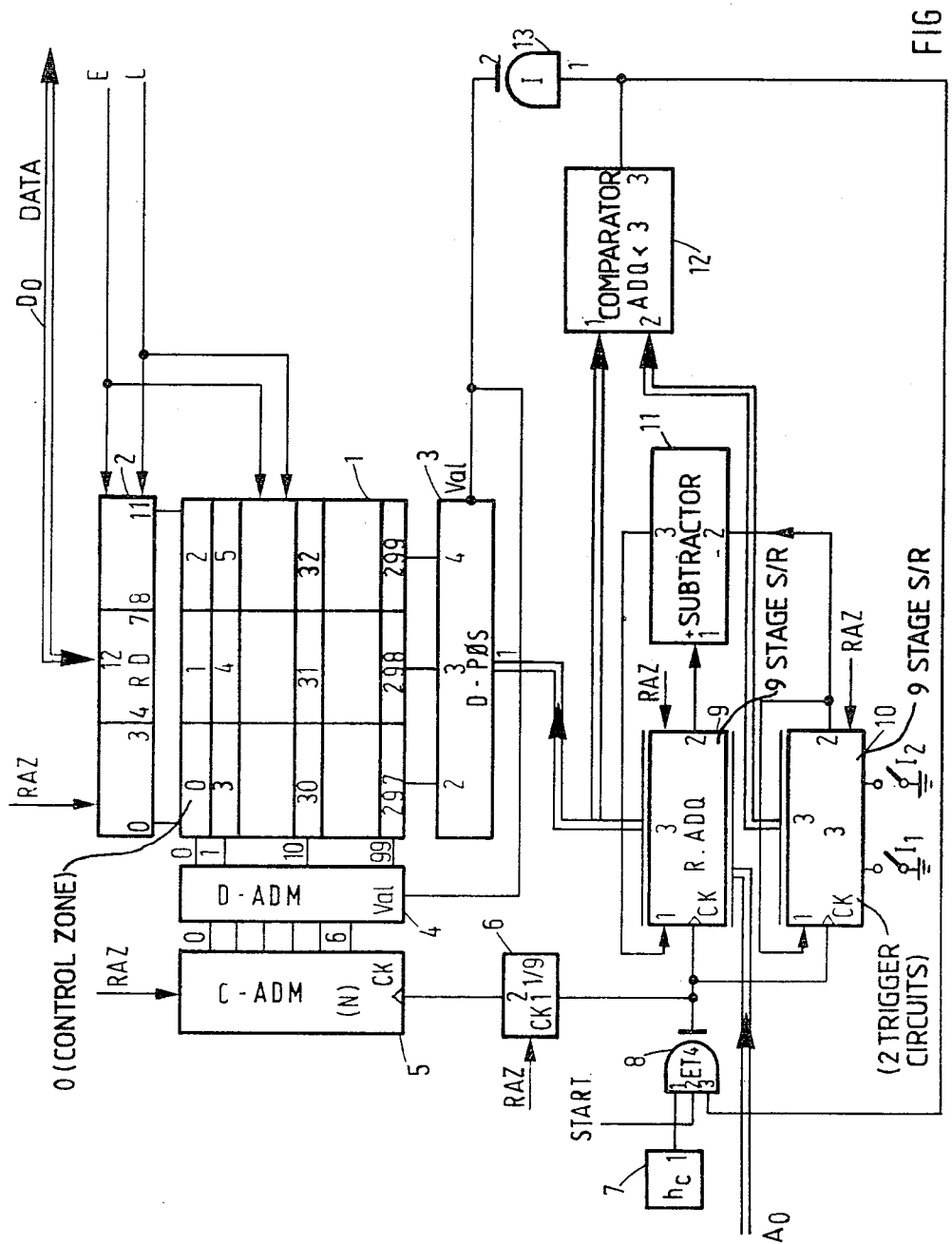

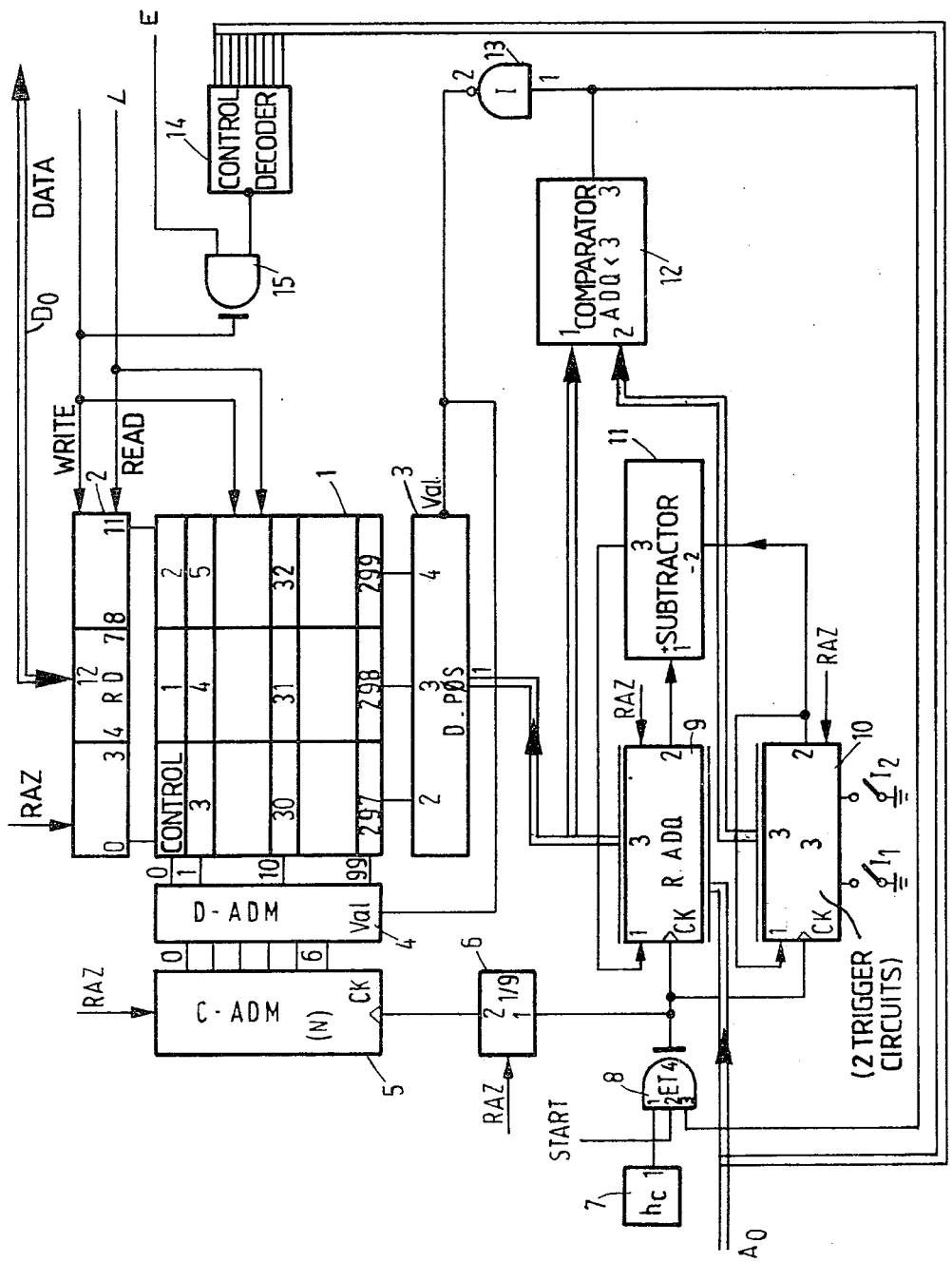

METHOD OF AND APPARATUS FOR INSCRIBING A CONTROL CHARACTER IN A MEMORY

TECHNICAL FIELD

The present invention relates generally to changeable memories and, more particularly, to a changeable memory employing a control character to determine if the characteristics of the memory matrix have been altered undesirably, and to a method of making same. The invention is described in connection with capacitive type memories, but it is to be understood that many of the principles are applicable to other types of memory matrices, such as magnetic core and ferroelectric matrices.

BACKGROUND ART

Capactive, magnetic and ferroelectric memories are extensively used to store data coded in binary form. In capacitive type memories, each information element or bit is stored in the memory as an electric charge Q. In certain types of capacitive matrix memories, binary values of one and zero are stored as the presence and absence of electric charges on capacitors. In other types of capacitive matrix memories, binary zero and one values are indicated by remnant capacitive and magnetic values, respectively associated with minus and plus charges and minus and plus magnetic fluxes.

Capacitive memories wherein binary zero and one values are represented by the presence and absence of electric charges are generally produced in metal oxide semiconductor (MOS) technology or metal nitride oxide semiconductor (MNOS) technology. A memory produced by MOS technology has access times of 450-1200 milliseconds and erase times of the order of one microsecond, whereas a memory produced by MNOS technology has access times of one microsecond and erase times of the order of 1-100 milliseconds. The significant difference between MOS and MNOS capacitive memories is that a dynamic MOS memory, i.e., an MOS memory that can be changed, is capable of retaining data in storage for only approximately one millisecond, whereas a dynamic MNOS capacitive memory can retain data for years.

Both MOS and MNOS memories, as well as ferroelectric and magnetic memories, have the disadvantage of being affected by a number of external physical disturbances. In particular, MOS and MNOS capacitive memories are frequently altered by exposure to certain types of electromagnetic radiation, such as ultraviolet radiation, that alters the amount of charge distributed within the memory. The charge alteration may modify the values of the stored data. Similarly, repeated access to MOS and MNOS capacitive memories causes progressive reduction in the quantity of charge stored in the memories. Also, variations in the current and voltage supplies for the memories may disturb and alter the stored data. MOS and MNOS memories also may prematurely age, to affect the permanence of data stored thereon. Magnetic and ferroelectric memories are also subject to variations, for example, in response to ambient magnetic and electric fields. These difficiencies are deleterious to the integrity and reliability of data stored in the various types of memories.

Several structures have been employed in the past in an attempt to maintain the integrity of data stored in memory matrices. For example, shields for magnetic, electric and electromagnetic fields have been provided about the periphery of the memory matrices to prevent the fields from being coupled to the matrices. Also, circuitry has been employed to establish regeneration cycles for charges stored in MOS and MNOS memory matrices. Circuitry has also been employed to decouple the memory matrices from drive circuits therefor in the event of failure of the drive circuits. Despite the use of these various structures to prevent variations in the values stored in a memory matrix, one can never be certain that a memory matrix has not been exposed to radiation at a particular instant, or that an electric phenomenon has not occurred which alters the data stored.

It is, accordingly, an object of the present invention to provide a dynamic memory that is constructed to enable undesirable changes in the memory elements to be detected, and to a method of making same.

It is another object of the invention to provide a dynamic memory with a checking device to determine whether or not a change in the memory is caused by means other than the circuits which normally drive the memory, or by secondary effects which cause undesirable changes, and to a method of making same.

Another object of the invention is to provide a memory with a circuit that enables the memory to be checked, and to assure effective decoupling of the checking circuit from the memory when the memory is in normal use, i.e., responsive to data read and write commands.

DISCLOSURE OF INVENTION

In accordance with the present invention, a memory is divided into at least two zones during production. One of the zones is a control or reference zone which receives a control character, while the remaining zones (referred to as certain zones in the claims) are responsive to and store data during normal operation of the memory when read and write commands are derived. The control character contains a predetermined number of binary zeros and ones, which are assigned to certain cells within the control zone. Each cell having a binary one value is supplied with a quantity of charge equal to or smaller than that utilized for writing binary data in the other zones, when the memory is of the MOS or MNOS type. The amount of charge supplied to the cells of the control zone is sufficient to enable binary one values to be read from the cells and for information to be stored in the cells. After the control character has been stored in the control zone, the control zone is isolated from writing circuits for the memory, during normal operation, by connecting an enabling circuit between a control circuit for the memory. The enabling circuit decouples the control zone from control circuits for the memory in response to the control zone being accessed during a write cycle, while the memory is being normally operated. The enable circuit couples read signals to the control zone when the control zone is accessed by a read signal during normal operation. Thereby, it is possible to determine if the character stored in the control zone has been altered undesirably. In magnetic, ferrite core and capacitive ferroelectric core memories, the permeance of the cores in the control zone is modified by the control character.

In the MOS and MNOS memories wherein the control zone has a charge in each cell less than the charge in the correspondingly valued cells in the other zones of the memory, the control character has a greater instability than the remainder of the zones. Hence, charge in cells of the control character may deteriorate before the charge in the cells of the other zones in a MOS or MNOS memory matrix. Therefore, during normal operation, each time the memory is accessed, a test of the control character may be performed. This optional feature enables determinations to be made as to whether the memory has been placed in a hostile environment which may cause changes in the stored values, and whether data in the memory are accurate. The present invention is applicable to all types of digital data processing systems, regardless of whether they be of large or pocket size. The invention insures the integrity of stored data in memory matrices at all times, and resolves problems of degradation or aging of data by protracted storage times.

The above and still further objects, features and advantages of the present invention will become apparent upon consideration of the following detailed description of several specific embodiments thereof, especially when taken in conjunction with the accompanying drawings.

BRIEF DESCRIPTION OF DRAWING

FIG. 2b is a diagram of a branch of a pair of MOS transistors in the circuit of FIG. 2a;

FIG. 3 is a block diagram of an apparatus for inserting a control character in a charge storage memory matrix;

FIG. 4 is a block diagram of a charge storage memory having a control character written into it, in combination with control circuits authorizing access to the control character in a data read out mode and prohibiting access to the control character in a data write mode.

BEST MODE FOR CARRYING OUT THE INVENTION

Figure 1:
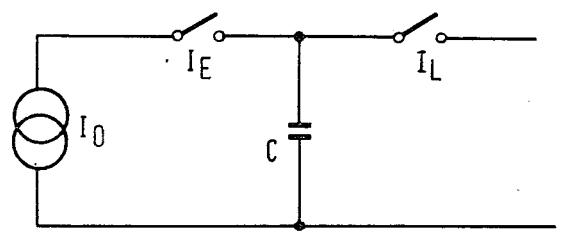
FIG. 1 is a circuit diagram, in simplified form, of a memory cell employing electric charge storage.

An MOS or MNOS charge storage cell, of the type utilized in a preferred embodiment of the present invention, is illustrated in FIG. 1 as including a capacitor C supplied by a current generator $I_0$ via a switch $I_E$. In response to switch $I_E$ being closed, the current supplied by current generator $I_0$ flows into capacitor C, to charge the capacitor with a quantity of charge, $\Delta Q$, depending upon the amplitude of the current $I_0$ derived from the current generator and the time $\Delta t$ during which switch $I_E$ is closed; the quantity of charge is indicated by $\Delta Q = I_0 \Delta t$. If the amplitude of the current $I_0$ derived from the generator and the time interval $\Delta t$ are constant, the quantity of charge supplied to capacitor C is constant each time switch $I_E$ is closed. Thus, a charge $Q_1 = n_1 I_0 \Delta t$ is stored in capacitor C in response to switch $I_E$ being closed $n_1$ times.

In accordance with one method of operation of the present invention, capacitive storage cells forming a control character in a control zone of a capacitive MOS or MNOS memory matrix are supplied with a smaller quantity of charge than the amount of charge employed to store data bits in remaining zones of the memory matrix. Thus, storage cells in the memory matrix which are set aside for a control character store a quantity of charge $Q_1 = n_1 I_0 \Delta t$, while the cells which are in other zones of the memory matrix are supplied with a greater amount of charge $Q_2 = n_2 I_0 \Delta t$, where $n_2$ corresponds to the number of times switch $I_E$ is closed for the data bits in the other memory zones. The integer $n_2$ preferably exceeds the integer $n_1$, so that the quantity of charge $Q_1$ is smaller than the quantity of charge $Q_2$. It is to be understood, however, that in certain instances $n_2$ equals $n_1$. In no event, however, is $n_1$ greater than $n_2$.

In response to the cells in the two zones of the memory being supplied with charges $Q_1$ and $Q_2$, the cells are maintained at potentials of $$U_{L1} = Q_1/C \text{ and } U_{L2} = Q_2/C,$$

respectively; whereby $U_{L2}$ is greater than $U_{L1}$. The potential difference across electrodes of the capacitors in the MOS or MNOS capacitive memory matrix is read by external circuits in response to closure of switch $I_L$. It is to be understood that differing charges may be stored on the capacitors in the different zones of the MOS or MNOS memory matrix by applying differing voltages to the capacitors of the differing zones. Hence, charges $Q_1$ and $Q_2$ in the two different portions of the MOS or MNOS capacitive memory matrix can be obtained by applying voltages $U_1$ and $U_2$ to the capacitors of the different zones for the same number of switch closures. Also, it is possible to obtain differing charges on the capacitors of the capacitors in the two different zones by supplying equal voltages to the capacitors in the different zones, but changing the time interval during which the voltages are applied to the cells.

Figure 2A:
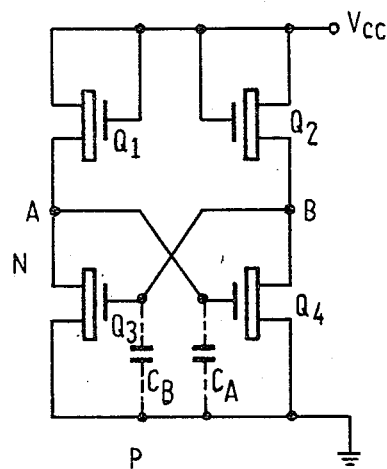
FIG. 2a is a circuit diagram of a memory cell of the type employed in MOS and MNOS technology.

FIG. 2a is a circuit diagram of an MOS or MNOS cell included in a memory matrix with which the present invention may be utilized. The memory cell illustrated in FIG. 2a includes four MOS or MNOS transistors $Q_1$–$Q_4$. Transistors $Q_1$ and $Q_2$ are resistive loads for transistors $Q_3$ and $Q_4$ which are cross coupled to each other by DC connections between the gates and source electrodes thereof. Substantial parasitic capacities $C_a$ and $C_b$ subsist between the gate and drain electrodes of transistors $Q_4$ and $Q_3$ respectively. A binary one data bit is stored in one of the branches $Q_1$, $Q_3$ or $Q_2$, $Q_4$ in response to the transistors of the other branch being rendered conductive. The data bit is retained on the parasitic capacitance $C_a$ or $C_b$ in the absence of a DC power supply voltage $V_{cc}$ being coupled to the source drain path of the transistor on which the charge is stored between the gate and drain electrodes thereof.

Figure 2B:
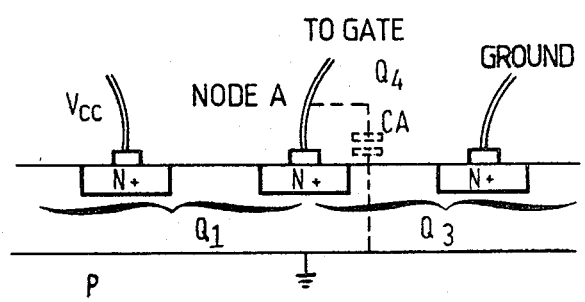

In an embodiment wherein transistors $Q_1$–$Q_4$ are MOS transistors, as illustrated in FIG. 2b, the charge on one of the parasitic capacitors $C_a$ or $C_b$ is discharged slowly into a junction formed by an N diffusion zone at node A or B, at the source electrodes of transistors $Q_3$ and $Q_4$, and a P-type substrate which is at ground potential. In FIG. 2b, a branch including MOS transistors $Q_1$ and $Q_3$ is illustrated. The branch includes grounded P-type substrates, three N+ doped regions, over which are laid three oxide layers, on which are located three ohmic contacts respectively connected to (1) a DC supply voltage $V_C$, (2) node A, common to the drain and source of transistors $Q_1$ and $Q_3$ and connected to the gate of transistor $Q_4$ and (3) ground. Parasitic capacitance $C_a$ subsists between node A and the ground potential at which the P-type substrate is maintained. Charge leaks off of parasitic capacitance $C_a$ in approximately one millisecond and must therefore be constantly renewed.

Figure 2C:
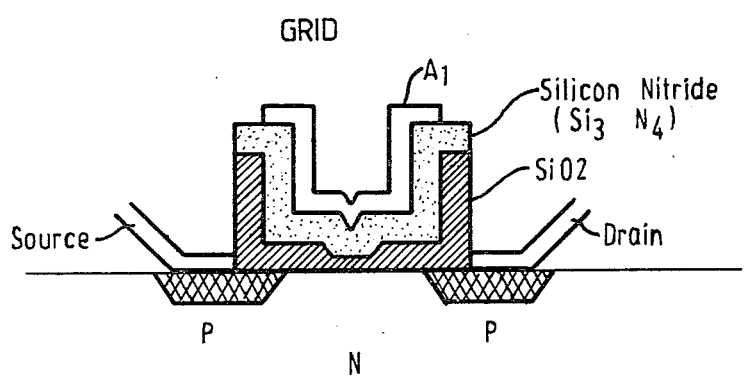
FIG. 2c is a diagram of an MNOS transistor.

The discharge effect of MOS circuitry can be eliminated by the use of an MNOS transistor, as illustrated in FIG. 2c. A single MNOS transistor includes an N-type substrate and two P-type diffusion zones. One of the P-type diffusion zones is connected as a source electrode, while the other is connected as the transistor drain electrode. On the surface of the N-type substrate and bridging the two P-type diffusion zones are successively layers of silicon oxide $SiO_2$, silicon nitride $Si_3N_4$, and aluminum Al. An ohmic contact exists between the aluminum and silicon nitride layers, while aluminum pads are formed on the two P-type zones to form the source and drain electrodes.

When a transistor of the type illustrated in FIG. 2c is normally biased by current generators and external voltages, electrical charges flow from the P diffusion zones to the gate electrode through the very thin $SiO_2$ layer. A tunnel effect occurs to block these electrical charges in the silicon nitride layer. In the absence of any supply from external sources, the charges remain localized in the silicon nitride layer and, thereby, enable the transistor to store an indication of a binary bit value for an extremely long time, such as years.

A number of cells of the type schematically illustrated in FIG. 2a are interconnected with each other to form a matrix. In this form, each intersection of a row and column of the matrix is defined by a pair of circuits of the type illustrated in FIG. 2a. A binary one value is stored as a charge on the parasitic capacitance between the gate and drain of one of the transistors $Q_3$ or $Q_4$, while a binary zero value is indicated by a charge being stored on the parasitic capacitance between the source and drain of the other one of transistors $Q_3$ or $Q_4$.

In FIG. 3, a matrix 1 having a multiplicity of charge storage elements of the type illustrated in FIG. 2a includes twelve columns 0–11 and one hundred rows 0–99. Each of the rows is divided into three zones, so that four cells are included in each zone. Each zone can thus be considered as storing a four bit word. In row 0, the three four bit zones are thus numbered 0, 1 and 2; in row 1, the zones are numbered 3, 4 and 5; . . . in row 10, the zones are numbered 30, 31 and 32; . . . in row 99 (the last row), the zones are numbered 297, 298 and 299. Thus, three hundred zones are included in the memory schematically illustrated in FIG. 2.

In response to a command to write data into or read data from any of zones 1–299 (referred to as certain zones in the claims), during normal operation, four binary bits are either written into or read from the address zone. The remaining zone, zone 0, is a control or reference zone into which a predetermined sequence of four binary bits is written prior to the initiation of normal operation of memory matrix 1. Subsequently, it is impossible to write additional data into control zone 0, but it is possible to read the predetermined code from the control zone. Thereby, it is impossible, during normal operation, to alter the binary sequence stored in the control zone with data signals. However, during normal operation, it is possible to read the predetermined sequence from the control zone, in order to determine if the control zone has been deleteriously affected by external influences which would also adversely affect the data stored in zones 1–299. If an indication is derived that the sequence read from control zone 0 is not the predetermined sequence, an indication is derived that the data in memory 1 are inaccurate and should not be utilized.

Accessing a particular address in memory matrix 1 is performed by column position decoder 3 and row position decoder 4, respectively having three and one hundred output leads. Row decoder 4 has one hundred output leads, one for each of the one hundred rows of matrix 1. In contrast, column decoder 3 has only three output leads, for the three different zones in each row. Four cells in memory 1 are accessed each time a pair of binary ones is derived from each of decoders 3 and 4. The four cells which are written into or read out of correspond with the cells in the zone which is accessed by the output leads of decoders 3 and 4 on which are derived binary one levels. For example, in response to binary one levels being derived on output leads 3 and 10 of decoders 3 and 4, respectively, the four cells in zone 31 are accessed, either for writing or reading purposes.

Line decoder 4 is responsive to a seven bit output signal of seven stage binary counter 5. Counter 5 has a clock (CK) input responsive to an output signal of a four stage binary counter 6, which is connected to form a divide by nine frequency divider. Counter 6 has a clock (CK) input responsive to clock signals from source 7, as coupled through AND gate 8, when the AND gate is enabled by a binary one START signal during an initial or starting interval.

Column decoder 3 is responsive to a nine bit output signal derived from nine stage shift register 9, containing the binary address of the zone of memory 1 which is to be accessed. Decoder 3 translates the nine bit output of shift register 9 into a three bit signal commensurate with the column in which the particular zone is located. For example, in response to shift register 9 deriving a binary one signal indicative of zone 297, decoder 3 enables memory 1 so that data can be written into or read from zone 297. Shift register 9 is responsive to a nine bit address bus $A_0$, which supplies a binary one or zero value to each of the stages of shift register 9, in accordance with the zone in memory 1 that is to be accessed. Shift register 9 also includes a clock (CK) input terminal responsive to the timing signals derived from source 7 during the interval while AND gate 8 is enabled by signal START. In response to each signal at the clock input of shift register 9, the shift register shifts the signals stored in the nine stages thereof to the right, whereby binary ones and zeros are sequentially derived from output terminal 2 of register 9 in response to each clock pulse derived from AND gate 8. Shift register 9 also includes an input terminal 1 which supplies binary one and zero signals to the first stage of the shift register.

During normal operation when data from a data processor, with which memory 1 is functioning, are written into zone 1–299 of memory 1 and bits are read from zones 0–299 of the memory, AND gate 8 is disabled, whereby no pulses are applied to the clock inputs of register 9 and counter 5. During such normal operation, the contents of a zone of memory 1 into which or from which data are respectively written and read are supplied to register 9 by address bus $A_0$. Register 9 responds to the address signal on bus $A_0$ and accesses the zone in memory 1 indicated by the address.

During the initial, starting period, when a predetermined sequence (e.g., 0101) is written into control zone 0, decoder 3 is activated so that it accesses control zone 0. To this end, a second nine stage shift register 10 and subtractor 11 are provided. Shift register 10 includes a clock (CK) input responsive to output pulse of clock source 7, as coupled through AND gate 8 during the interval while signal START has a binary one value. Shift register 10 is a feedback shift register including an output terminal 2 which is coupled back to input terminal 1 of shift register 10, to provide recirculation of a signal initially stored in the shift register. Initially, shift register 10 is loaded with the decimal number 3, a result achieved by initially closing switches $I_1$ and $I_2$ which are coupled to trigger circuits for the first and second least significant bit stages of register 10. Thereby, the first and second least significant bit stages of register 10 are loaded with binary one values, while the remaining stages of register 10 are loaded with zeros so that register 10 stores the value 0011.

To force accessing of memory matrix 1 back to control zone 0 during the initial write period, to enable the control zone to have the predetermined sequence (0101) loaded therein, input terminal 1 of shift register 9 is responsive to output terminal 3 of subtractor 11. Subtractor 11 includes minuend input terminal 1 and subtrahend input terminal 2, respectively responsive to the serial output signals of shift registers 9 and 10. Immediately after enabling of AND gate 8 by a binary one value for signal START, shift register 9 stores the address of matrix 1 which has previously been accessed, for data write or read purposes. In response to the ninth pulse from clock source 7 subsequent to signal START being derived, register 9 contains the initial address previously supplied to the register by bus $A_0$ minus three. Thereby, upon completion of nine pulses coupled through AND gate 8, the output of register 9, on bus 3, is reduced by three relative to the value on output bus 3 of register 9 at the time of a zero to one transition of signal START. For every nine pulses supplied through AND gate 8, the count stored in register 5 is reduced by a value of one, whereby the number of the output lead of decoder 4 on which a binary one value is derived is decremented by one.

Operation of registers 5, 9 and 10, as well as decoders 3 and 4 continues in this manner until the count stored in register 9 has been reduced to less than three as determined by comparator 12. Comparator 12 includes two nine bus inputs, respectively responsive to the nine bit output signals of shift registers 9 and 10. Comparator 12 derives a binary one output as long as the nine bit output of shift register 9 exceeds that of shift register 10. The binary one output of comparator 12 is supplied to one of the inputs of AND gate 8 to enable the AND gate until the count of register 10 exceeds that of register 9. In response to the count of register 10 exceeding the count of register 9, as occurs when the count in register 9 is less than three, comparator 12 derives a binary zero output level. The binary zero output level of comparator 12 disables gate 8, to prevent the further application of pulses from clock source 7 to the clock input terminals of counter 6, as well as registers 9 and 10. Thereby, the states of decoders 3 and 4 are frozen. Simultaneously with disabling of AND gate 8, decoders 3 and 4 are enabled in response to a binary one signal derived from output terminal 2 of inverter 13, having an input terminal responsive to the output of comparator 12. With decoders 3 and 4 enabled, control zone 0 of memory matrix 1 is accessed. At this time, a binary one signal is supplied to write lead E while bits 0101 are applied by data bus $D_0$ to the four least significant bit stages a twelve stage buffer register 2; one stage of register is provided for and associated with one of the twelve columns of matrix 1. The write lead E is activated to a binary one state $n_1$ times, whereby the four cells in control zone 0 have charges 0, $n_1 I_0 \Delta t$, 0 and $n_1 I_0 \Delta t$ stored thereon to represent 0101.

During normal operation, data from a data processor of which memory 1 is a part are written into zones 1–299 in response to signals on data bus $D_0$ and in response to addressing of register 9 by address bus $A_0$. It is not possible to write data into control zone 0 during normal operation. It is, however, possible to read data from any of zones 0–299 of memory matrix 1 by supplying an enable signal to read lead L and by supplying an appropriate address signal to address bus $A_0$ which controls register 9 and decoder 3 to enable read out of zones 0–299.

To initialize the circuitry of the present invention, each of counter 5, counter 6, register 9 and register 10 is provided with a return to zero RAZ input lead. Each of these circuits is activated to a zero state in response to the derivation of a binary one level on lead RAZ.

Figure 5:
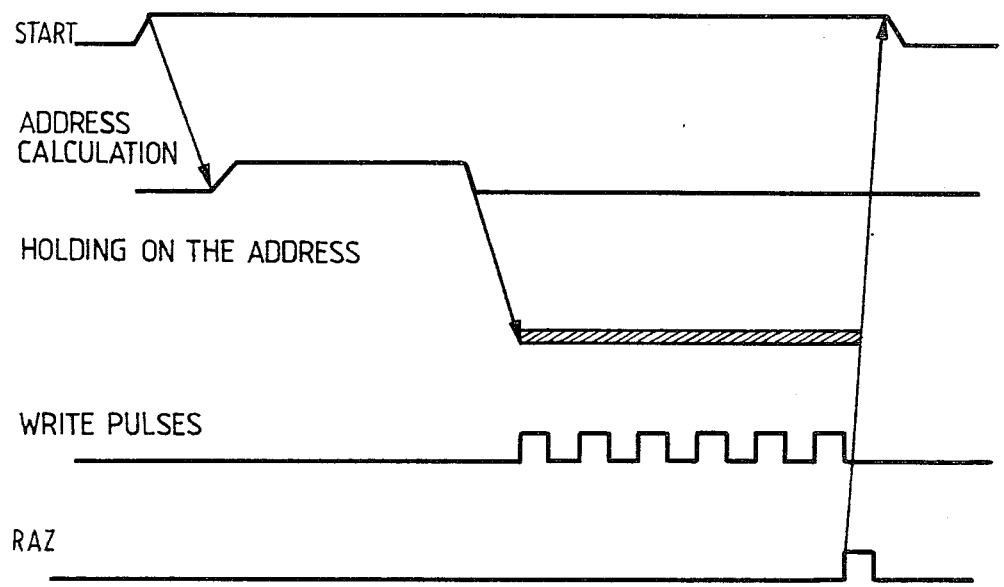
FIG. 5 is a timing diagram to assist in the description of FIGS. 3 and 4.

The operation of the device illustrated in FIG. 3 is now described in greater detail with reference to the timing diagram of FIG. 5. Upon initialization, address ADQ of a control character is fed by bus $A_0$ in binary form to register 9, simultaneously with the decimal number 3 being supplied to register 10 by closure of switches $I_1$ and $I_2$. When initialization has been completed, the address calculation is performed in response to application of signal START to an input of AND gate 8. The circuitry formed by registers 9 and 10, as well as subtractor 11, performs the operation ADQ=ADQ−3 in response to every nine clock pulses coupled from source 7 through AND gate 8. Simultaneously, counter 5 is advanced by one step in response to every nine clock pulses supplied through AND gate 8. This sequence of operation continues until the count in register 9 is less than the decimal number 3. In response to the count of register 9 being less than the decimal number 3, counter 5 contains the row address of the sought memory location and register 9 contains the address of the sought location. The control character is then written into the selected zone by supplying a predetermined number ($n_1$) of write pulses to lead E during the interval beginning at the end of address calculation and ending simultaneously with the occurrence of the trailing edge of signal START. The length of the charging period of the memory cells in the control character, and thereby the instability of the charge in the control character zone, depend on the interval.

Writing of the control character into zone 0 of memory 1 is performed during manufacture, prior to connecting memory matrix 1 with the remainder of the data processor or other circuits which are intended to cooperate with the memory during normal operation. When the entire product, including the memory matrix and the circuitry with which it is intended to cooperate, has been manufactured and connected, it is necessary to prevent accidental writing of data into the control zone of memory 1.

One preferred embodiment of circuitry which is connected to the memory address circuit after the predetermined sequence has been written into the control zone, to prevent modification of control zone 0, is illustrated in FIG. 4. The circuit of FIG. 4 includes all of the elements illustrated in FIG. 3. It is to be understood, however, that in certain instances, the circuitry which is utilized to access control zone 0 during a writing operation can be eliminated.

To prevent writing into control zone 0 during normal operation of the matrix, the circuit of FIG. 4 includes a control decoder 14 which drives AND gate 15, also responsive to write signals on lead E. Decoder 14 is responsive to the signal on address bus $A_0$, so that the decoder derives a binary one output in response to all signals on the address bus, except the address of control zone 0. In response to the address of control zone 0 of memory 1 being supplied to address bus $A_0$, control decoder 14 derives a binary zero level, to decouple the signal on lead E from buffer register 2 and memory matrix 1. Thereby, if a binary combination corresponding to that defining the address of zone 0 for the control character is supplied to address bus $A_0$, writing into memory 1 and into register 2 is prevented. The device illustrated in FIG. 4 thus prevents writing into control zone 1 during normal operation of matrix 1, but does not prevent read out of the control zone.

It is to be understood that it is possible to use the same addressing circuits to address control zone 0 of memory 1 as are employed in the finished product, and to write data into the remaining zones of the memory.

It follows from the description of the preferred embodiments that the problem of detecting information changes caused by physical disturbances, such as exposure of a memory matrix to certain types of electromagnetic radiation or because of repeated access to these data, is resolved by the apparatus and method of the invention. Similarly, it is to be understood that the apparatus and method of the invention may be utilized to verify the integrity of data stored in memory matrices, when such matrices are used for a protracted storage period, for example in warehouses of a data processing center or manufacturer.

While there have been described and illustrated several specific embodiments of the invention, it will be clear that variations in the details of the embodiments specifically illustrated and described may be made without departing from the true spirit and scope of the invention as defined in the appended claims.

I claim:

1. A method for enabling determination to be made as to whether binary data bit values stored in an erasable memory matrix are reliable, comprising dividing the matrix into a plurality of addressable zones, each zone including a plurality of cells for storing binary bit values, the zones being arranged so that an undesirable change in bit value in a cell of one zone due to undesirable ambient conditions is likely to be accompanied by an undesirable change in bit values in cells of other zones, certain of said zones being normally operative during reading and writing so data changes occur therein during normal writing operations, another of said zones being a reference zone for storing a predetermined binary bit sequence but incapable of being changed during normal writing operations, writing a predetermined binary bit sequence into the cells of the reference zone, then isolating the cells of said reference zone during writing of bit values into the cells of the certain zones so that changes in the bit values of the cells in said reference zone can occur only in response to the undesirable ambient conditions, writing in and reading out binary bit values from the cells of the certain zones during normal operation of the memory matrix in connection with operation of a data processor, and reading out the binary bit values from the cells of the reference zone to enable an indication to be derived as to whether the data stored in the normally operative zones are reliable or have been affected by an undesirable change.

2. The method of claim 1 wherein each of the cells is a capacitance for storing first and second binary values as the absence and presence of charge, applying a first quantity of charge to the cells storing the second value in the certain zones, applying a second quantity of charge to the cells storing the second value in the reference zone, the first quantity of charge being greater than the second quantity of charge.

3. In combination, an erasable memory matrix divided into a plurality of addressable zones, each zone including a plurality of cells for storing binary bit values, the zones being arranged so that an undesirable change in bit value in a cell of one zone due to undesirable ambient conditions is likely to be accompanied by an undesirable change in bit values in cells of other zones, certain of said zones being normally operative during reading and writing so data changes occur therein during normal writing operations, another of said zones being a reference zone for storing a predetermined binary bit sequence but incapable of being changed during normal writing operations, means for writing a predetermined binary bit sequence into the cells of said reference zone, means for isolating the cells of said reference zone during writing of bit values into the certain zones after the bit sequence has been written into the cells of said reference zone so that changes in the bit values of the cells in said reference zone can occur only in response to the undesirable ambient conditions, and means for writing in and reading out binary bit values from the cells of the certain zones during normal operation of the memory matrix in connection with operation of a data processor and for reading out the binary bit values from the cells of the reference zone, the isolating means preventing writing of binary bit values into the cells of the reference zone during normal operation, the reading out of binary bit values from the cells of the reference zone enabling an indication to be derived as to whether the data stored in the normally operative zones are reliable or have been affected by an undesirable change.

4. Apparatus for controlling an erasable memory matrix divided into a plurality of addressable zones, each zone including a plurality of cells for storing binary bit values, certain of said zones being normally operative during reading and writing so data changes occur therein during normal writing operations, another of said zones being a reference zone for storing a predetermined binary bit sequence but incapable of being changed during normal writing operations, the zones being arranged so that an undesirable change in bit value in a cell of one zone due to undesirable ambient conditions is likely to be accompanied by an undesirable change in bit value in cells of other zones, comprising addressing means for the memory zones, means for writing a predetermined binary bit sequence into the cells of the reference zone in response to an address signal for the reference zone being supplied to the addressing means, means for isolating the addressing means from the cells of said reference zone during writing of bit values into the certain zones after the sequence has been written into the reference zone so that changes in the bit values of the cells in said reference zone occur only in response to the undesirable ambient conditions, said addressing means enabling writing in and reading out of binary bit values from the cells of the certain zones during normal operation of the memory matrix in connection with operation of a data processor and reading out the binary bit values from the cells of the certain zone, the isolating means preventing writing of binary bit values into the cells of the reference zone during normal operation, the reading out of binary bit values from the cells of the reference zone enabling an indication to be derived as to whether the data stored in the normally operative zones are reliable or have been affected by an undesirable change.

5. The method of claim 1 wherein said memory is formed by cells for storing electrical charges, comprising supplying a particular number of charge storage cells in said one zone with a quantity of charge no greater than the charge utilized for writing binary data in one of said other zones.

6. A method for enabling determinations to be made as to whether binary data bit values stored in an erasable memory are reliable, comprising dividing the memory into a plurality of addressable zones, each zone including a plurality of cells for storing binary bit values, the zones being arranged so that an undesirable change in bit value in a cell of one zone due to undesirable ambient conditions is likely to be accompanied by an undesirable change in bit values in cells of other zones, certain of said zones being normally operative during reading and writing so data changes occur therein during normal writing operations, another of said zones being a reference zone for storing a predetermined binary bit sequence but incapable of being changed during normal writing operations, writing a predetermined binary bit sequence into the cells of the reference zone, then isolating the cells of said reference zone during writing of bit values into the cells of the certain zones so that changes in the bit values of the cells in said reference zone can occur only in response to the undesirable ambient conditions, writing in and reading out binary bit values from the cells of the certain zones during normal operation of the memory in connection with operation of a data processor, and reading out the binary bit values from the cells of the reference zone to enable an indication to be derived as to whether the data stored in the normally operative zones are reliable or have been affected by an undesirable change.

7. The method of claim 6 wherein each of the cells is a capacitance for storing first and second binary values as the absence and presence of charge, applying a first quantity of charge to the cells storing the second value in the certain zones, applying a second quantity of charge to the cells storing the second value in the reference zone, the first quantity of charge being greater than the second quantity of charge.

8. In combination, an erasable memory divided into a plurality of addressable zones, each zone including a plurality of cells for storing binary bit values, certain of said zones being normally operative during reading and writing so data changes occur therein during normal writing operations, another of said zones being a reference zone for storing a predetermined binary bit sequence but incapable of being changed during normal writing operations, the zones being arranged so that an undesirable change in bit value in a cell of the reference zone due to undesirable ambient conditions is likely to be accompanied by an undesirable change in bit values in cells of other zones, means for writing a predetermined binary bit sequence into the cells of said reference zone, means for isolating the cells of said reference zone during writing of bit values into the certain zones of the memory after the bit sequence has been written into the cells of said reference zone so that changes in the bit values of the cells in said reference zone can occur only in response to the undesirable ambient conditions, and means for writing in and reading out binary bit values from the cells of the certain zones during normal operation of the memory in connection with operation of a data processor and for reading out the binary bit values from the cells of the reference zone, the isolating means preventing writing of binary bit values into the cells of the reference zone during normal operation, the reading out of binary bit values from the cells of the reference zone enabling an indication to be derived as to whether the data stored in the normally operative zones are reliable or have been affected by an undesirable change.

9. Apparatus for controlling an erasable memory divided into a plurality of addressable zones, each zone includng a plurality of cells for storing binary bit values, certain of said zones being normally operative during reading and writing so data changes occur therein during normal writing operations, another of said zones being a reference zone for storing a predetermined binary bit sequence but incapable of being changed during normal writing operations, the zones being arranged so that an undesirable change in bit value in a cell of one zone due to undesirable ambient conditions is likely to be accompanied by an undesirable change in bit value in cells of other zones, comprising addressing means for the memory zones, means for writing a predetermined binary bit sequence into the cells of the reference zone in response to an address signal for the reference zone being supplied to the addressing means, means for isolating the addressing means from the cells of said reference zone during writing of bit values into the memory after the sequence has been written into the reference zone so that changes in the bit values of the cells in said reference zone occur only in response to the undesirable ambient conditions, said addressing means enabling writing in and reading out of binary bit values from the cells of the certain zones during normal operation of the memory in connection with operation of a data processor and reading out the binary bit values from the cells of the reference zone, the isolating means preventing writing of binary bit values into the cells of the reference zone during normal operation, the reading out of binary bit values from the cells of the reference zone enabling an indication to be derived as to whether the data stored in the normally operative zones are reliable or have been affected by an undesirable change.

10. The method of claim 6 or 7 wherein the binary bit sequence is written into the cells of the reference zone during manufacture of the memory.

* * * * *